(12) United States Patent
Yoon et al.

(10) Patent No.: US 9,720,828 B2
(45) Date of Patent: Aug. 1, 2017

(54) ELECTRONIC DEVICE

(71) Applicants: Sung-Joon Yoon, Gyeonggi-do (KR); Tadashi Kai, Tokyo (JP)

(72) Inventors: Sung-Joon Yoon, Gyeonggi-do (KR); Tadashi Kai, Tokyo (JP)

(73) Assignees: SK Hynix Inc., Gyeonggi-do (KR); KABUSHIKI KAISHA TOSHIBA, Tokyo (JP)

( * ) Notice: Subject to any disclaimer, the term of this patent is extended or adjusted under 35 U.S.C. 154(b) by 308 days.

(21) Appl. No.: 14/562,443

(22) Filed: Dec. 5, 2014

(65) Prior Publication Data

US 2015/0249203 A1 Sep. 3, 2015

(30) Foreign Application Priority Data

Mar. 3, 2014 (KR) .................. 10-2014-0025080

(51) Int. Cl.
*H01L 43/08* (2006.01)
*G06F 12/08* (2016.01)
*H01L 27/22* (2006.01)

(52) U.S. Cl.
CPC .............. *G06F 12/08* (2013.01); *H01L 43/08* (2013.01); *H01L 27/224* (2013.01); *H01L 27/228* (2013.01)

(58) Field of Classification Search
CPC ................... H01L 43/02; H01L 43/08; G11C 11/14–11/16; G11C 11/161
See application file for complete search history.

(56) References Cited

U.S. PATENT DOCUMENTS

| | | | |
|---|---|---|---|
| 6,794,695 B2 | 9/2004 | Sharma et al. | |
| 8,004,881 B2* | 8/2011 | Zhu ................ | G11C 11/16 365/148 |
| 2007/0085068 A1* | 4/2007 | Apalkov .......... | B82Y 25/00 257/1 |
| 2010/0193888 A1 | 8/2010 | Gu et al. | |
| 2013/0240963 A1* | 9/2013 | Beach .............. | H01L 43/08 257/295 |
| 2014/0048895 A1* | 2/2014 | Huang ............. | H01L 43/02 257/421 |

* cited by examiner

*Primary Examiner* — Allison P Bernstein
(74) *Attorney, Agent, or Firm* — IP & T Group LLP

(57) ABSTRACT

An electronic device includes a first magnetic layer pinned in its magnetization direction, a third magnetic layer pinned in its magnetization direction, a second magnetic layer interposed between the first magnetic layer and the third magnetic layer, and changeable in its magnetization direction, a barrier layer interposed between the first magnetic layer and the second magnetic layer, and a dielectric layer interposed between the second magnetic layer and the third magnetic layer, wherein the first magnetic layer has a width 1.5 to 5 times wider than a width of the second magnetic layer.

20 Claims, 13 Drawing Sheets

ELECTRONIC DEVICE

CROSS-REFERENCE TO RELATED APPLICATIONS

The present application claims priority of Korean Patent Application No. 10-2014-0025080, entitled "ELECTRONIC DEVICE" and filed on Mar. 3, 2014, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device in which an improved patterning of a resistance variable element is provided to improve the characteristics of the resistance variable element.

In one aspect, an electronic device is provided to include a semiconductor memory unit that includes: a first magnetic layer with a pinned magnetization direction; a third magnetic layer with a pinned magnetization direction; a second magnetic layer interposed between the first magnetic layer and the third magnetic layer, and with an unpinned magnetization direction; a barrier layer interposed between the first magnetic layer and the second magnetic layer; and a dielectric layer interposed between the second magnetic layer and the third magnetic layer, wherein the width of the first magnetic layer is 1.5 to 5 times wider than the width of the second magnetic layer.

Implementations of the above electronic device may include one or more the following.

The width of third magnetic layer may be 1.5 to 5 times wider than the width of the second magnetic layer. The first to third magnetic layers may be magnetized in a vertical direction perpendicular to upper surfaces of the first to third magnetic layers. The first to third magnetic layers may be magnetized in a horizontal direction, which is parallel to upper surfaces of the first to third magnetic layers. The barrier layer may include dielectric material or nonmagnetic conductive material. The third magnetic layer may include a bottom magnetic layer, a top magnetic layer and a nonmagnetic layer which is interposed between the bottom magnetic layer and the top magnetic layer. The width of the first magnetic layer may be about 2.5 times wider than the width of the second magnetic layer. The semiconductor memory unit may further include a first conductive layer coupled to the first magnetic layer; and a second conductive layer coupled to the third magnetic layer. The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit is part of the memory unit in the microprocessor. The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that is part of the cache memory unit in the processor. The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory unit is part of the auxiliary memory device or the main memory device in the processing system. The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit is part of the storage device or the temporary storage device in the data storage system. The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that is part of the memory or the buffer memory in the memory system.

In one aspect, an electronic device is provided to include a semiconductor memory unit that includes: a first magnetic layer with a pinned magnetization direction; a third magnetic layer with an unpinned magnetization direction; a second magnetic layer interposed between the first magnetic layer and the third magnetic layer, and with a pinned magnetization direction; a barrier layer interposed between the first magnetic layer and the second magnetic layer; and a dielectric layer interposed between the second magnetic layer and the third magnetic layer, wherein the width of the second magnetic layer is 1.5 to 5 times wider than the width of the third magnetic layer.

Implementations of the above method may include one or more of the following.

The width of the first magnetic layer may be 1.5 to 5 times wider than the width of the third magnetic layer. The first to third magnetic layers may be magnetized in a vertical direction, which is perpendicular to upper surfaces of the first to third magnetic layers. The first to third magnetic layers may be magnetized in a horizontal direction, which is parallel to upper surfaces of the first to third magnetic layers. The barrier layer may include a nonmagnetic conductive material. The width of the second magnetic layer may be 2.5 times wider than the width of the third magnetic layer. The semiconductor memory unit may further include: a first conductive layer coupled to the first magnetic layer; and a second conductive layer coupled to the third magnetic layer.

In one aspect, an electronic device may include a first magnetic layer with a pinned magnetization direction; a second magnetic layer with an unpinned magnetization direction; and a third magnetic layer with a pinned magnetization direction, wherein the first, the second, and the third magnetic layers form a stacked structure, and wherein at least one of the first and the third magnetic layers has a width 1.5 to 5 times wider than the width of the second magnetic layer.

Implementations of the above method may include one or more of the following.

The second magnetic layer may be provided between the first and the third magnetic layers. The first magnetic layer may be provided between the second and the third magnetic layers. The third magnetic layer may be provided between the first and the second magnetic layers.

According to the above implementations, the switching characteristic of a resistance variable element may be improved by controlling the relative width of a pinned magnetic layer to a condition where a total sum of the horizontal component and the vertical component of a stray magnetic field influencing a free magnetic layer is minimized.

DETAILED DESCRIPTION

Figure 1A:
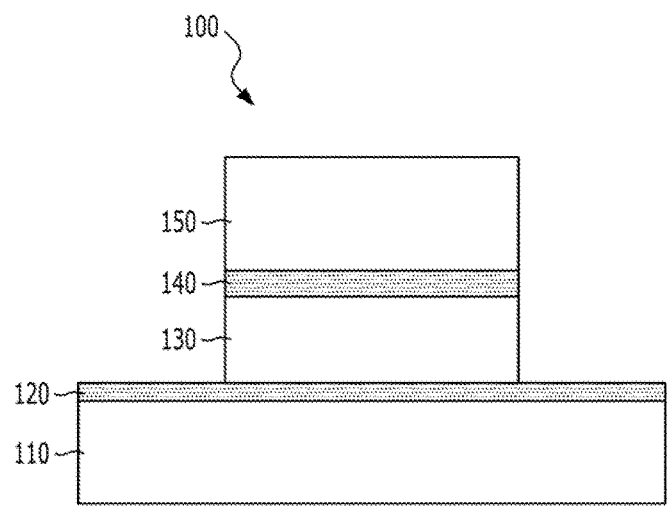
FIG. 1A is a cross-sectional view illustrating an electronic device in accordance with a first implementation.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Figure 1B:
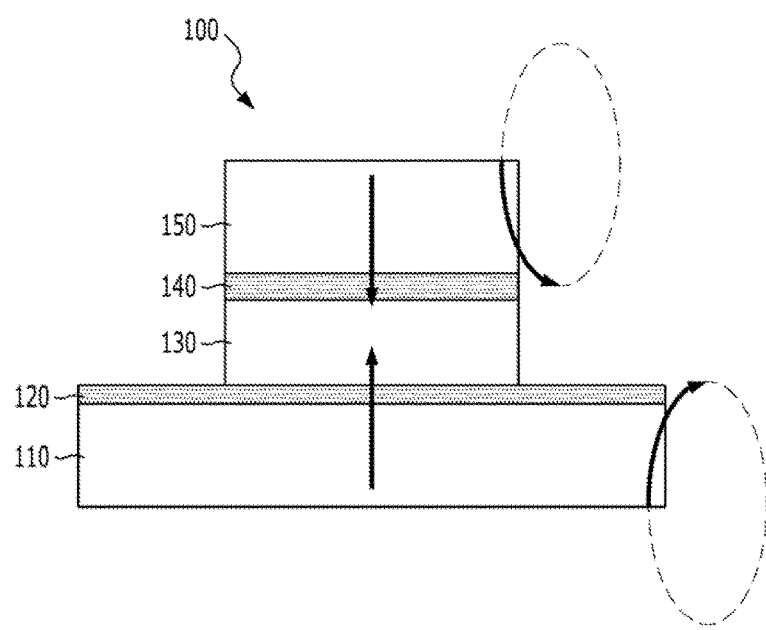
FIG. 1B is a cross-sectional view explaining a stray magnetic field which is applied to the electronic device in accordance with the first implementation.
Figure 7:
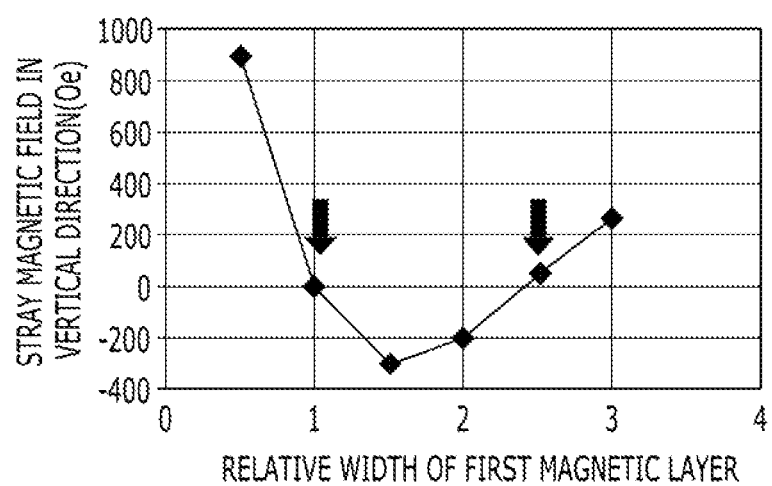
FIG. 7 is a graph showing a relationship between a stray magnetic field applied in a vertical direction according to and a relative width of a first magnetic layer.

FIG. 1A is a cross-sectional view illustrating an electronic device in accordance with a first implementation, FIG. 1B is a cross-sectional view illustrating a stray magnetic field which is applied to the electronic device in accordance with the first implementation, and FIG. 7 is a graph showing a relationship between a stray magnetic field applied in a vertical direction and a relative width of a first magnetic layer.

Figure 2:
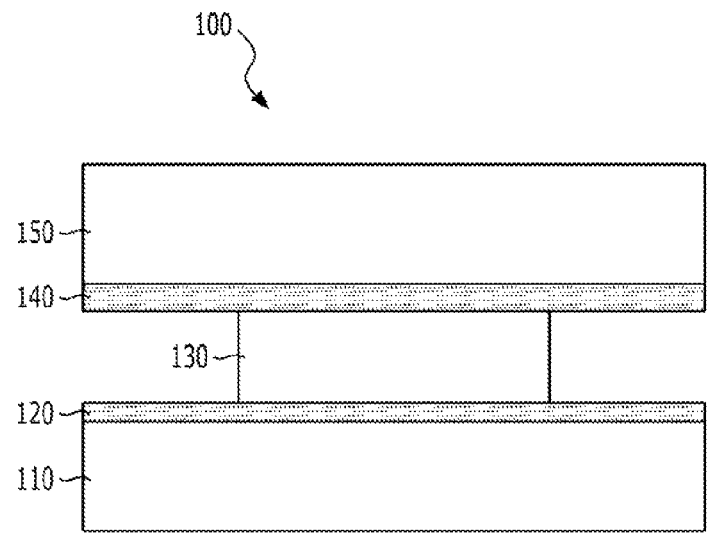
FIGS. 2 to 4 are cross-sectional views illustrating electronic devices in accordance with second to fourth implementations.

Referring to FIG. 1A, a resistance variable element 100 of an electronic device in accordance with a first implementation may include a first magnetic layer 110 with a pinned magnetization direction, a third magnetic layer 150 with a pinned magnetization direction, a second magnetic layer 130 which is interposed between the first magnetic layer 110 and the third magnetic layer 150 and having a magnetization direction that is changeable (or unpinned), a barrier layer 120 which is interposed between the first magnetic layer 110 and the second magnetic layer 130, and a dielectric layer 140 which is interposed between the second magnetic layer 130 and the third magnetic layer 150. The first magnetic layer 110 may be wider than the second magnetic layer 130. In another implementation, the resistance variable element 100 may be stacked in reverse order, That is, the layers 110, 120, 30, 140, and 150 may be stacked in the order reverse to what is shown in FIG. 2.

The resistance variable element 100 may include a magnetic tunnel junction (MTJ) structure. Electrical resistance of the magnetic tunnel junction (MTJ) structure can be changed using a voltage or current that is applied to both ends thereof to switch between two or more resistant states. Electrical resistance of a resistance variable element 100 may change according to the magnetization direction of the second magnetic layer 130, which serves as a free magnetic layer. For example, the resistance variable element 100 may go to a low resistant state when the magnetization direction of the third magnetic layer 150, serving as a pinned magnetic layer or a reference layer, and the magnetization direction of the second magnetic layer 130, are parallel, and may go to a high resistant state when the magnetization directions are anti-parallel. The magnetization direction of the second magnetic layer 130 may change through a spin transfer torque (STT) or a magnetic field.

Each of first to third magnetic layers 110, 130 and 150 may include a ferromagnetic material such as ferrum (Fe), nickel (Ni), cobalt (Co), gadolinium (Gd), dysprosium (Dy), and alloys thereof, for example, cobalt-ferrum (CoFe), nickel-ferrum (NiFe), and cobalt-ferrum-nickel (CoFeNi). In another embodiment, the first to third magnetic layers 110, 130 and 150 may include an alloy of the ferromagnetic material and a platinum group element such as platinum (Pt) and palladium (Pd), for example, cobalt-platinum (CoPt), cobalt-palladium (CoPd), ferrum-platinum (FePt) and ferrum-palladium (FePd).

Various elements may be added to the ferromagnetic material and the alloy thereof to improve the properties of the first to third magnetic layers 110, 130 and 150. For example, each of the first to third magnetic layers 110, 130 and 150 may include cobalt-ferrum-boron (CoFeB), cobalt-platinum-boron (CoPtB), cobalt-palladium-boron (CoPdB), ferrum-platinum-boron (FePtB) or ferrum-palladium-boron (FePdB), which are prepared by adding boron (B) to cobalt-ferrum (CoFe), cobalt-platinum (CoPt), cobalt-palladium (CoPd), ferrum-platinum (FePt) and ferrum-palladium (Feed), respectively. In another embodiment, each of the first to third magnetic layers 110, 130 and 150 may include cobalt-ferrum-boron-tantalum (CoFeBTa) or cobalt-ferrum-boron-silicon (CoFeBSi), which is prepared by adding tantalum or silicon to cobalt-ferrum-boron (CoFeB) respectively. In another embodiment, each of the first to third magnetic layers 110, 130 and 150 may be a multi-layer structure including a combination of the above-mentioned layers.

The first to third magnetic layers 110, 130 and 150 may be magnetized in the vertical direction with respect to upper surfaces of the first to third magnetic layers 110, 130 and 150. In particular, since the width of the first magnetic layer 110 is wider than the width of the second magnetic layer 130, it is possible to protect the second magnetic layer 130 from stray magnetic fields in a horizontal direction. The stray magnetic field occurs mainly at the periphery of the first magnetic layer 110.

Referring to FIG. 7, when the widths of the first magnetic layer 110 and the second magnetic layer 130 are the same, a vertical magnetic field by the first magnetic field 110, serving as a pinned magnetic layer or a magnetic correction layer, and a vertical magnetic field by the third magnetic layer 150 may be offset. Thus, any stray magnetic field in the vertical direction may be reduced or eliminated. When the width of the second magnetic layer 130 and the width of the first magnetic layer 110 are different from each other, vertically oriented stray magnetic fields may increase. However, when the width of the first magnetic layer 110 with respect to the width of the second magnetic layer 130 has a ratio other than 1, for example, 2.5, the vertically oriented stray magnetic field may be reduced or eliminated.

In addition, although variation may occur in the layers of the resistance variable element 100, the sum of the stray magnetic fields in the horizontal direction and the stray magnetic field in the vertical direction may be minimized when the relative width of the first magnetic layer 110 with respect to the width of the second magnetic layer 130 is 1.5 to 5. According to this fact, the first magnetic layer 110 may be formed to have a width 1.5 to 5 times wider than the width of the second magnetic layer 130. For example, the first magnetic layer 110 may have a width 2.5 times wider than the width of the second magnetic layer 130.

The first to third magnetic layers 110, 130 and 150 may be magnetized in the horizontal direction with respect to the upper surfaces thereof. Even in this case, by setting the width of the first magnetic layer 110 to be wider than the width of the second magnetic layer 130, it is possible to minimize the influence of stray magnetic fields on the second magnetic layer 130.

The barrier layer 120 may include a dielectric material which may serve as a tunneling barrier or a conductive material which may magnetically isolate the first magnetic layer 110 and the second magnetic layer 130 from each other. For example, the barrier layer 120 may be: (i) a single layer of nonmagnetic dielectric material such as magnesium oxide (MgO), aluminum oxide (AlO), silicon oxide (SiO), bismuth oxide (BiO), magnesium nitride (MgN), aluminum nitride (AlN), silicon nitride (SiN) magnesium fluoride (MgF) and a calcium fluoride (CaF); (ii) a single layer of a nonmagnetic metal such as ruthenium (Ru), chrome (Cr), copper (Cu), titanium (Ti), tungsten (W), and tantalum (Ta); or (iii) a multi-layer thereof.

The dielectric layer 140 serving as a tunneling barrier may be formed by depositing nonmagnetic dielectric material such as a magnesium oxide (MgO), an aluminum oxide (AlO) a silicon oxide (SiO), a bismuth oxide (BiO), a magnesium nitride (MgN), an aluminum nitride (AlN), a silicon nitride (SiN), a magnesium fluoride (MgF) and a calcium fluoride (CaF), through RF (radio frequency) sputtering or pulsed DC (direct current) sputtering. In another embodiment, the dielectric layer 140 may be formed by depositing a metal such as magnesium (Mg), aluminum (Al), titanium (Ti), tantalum (Ta) and hafnium (Hf) and then oxidating the deposited metal. The dielectric layer 140 may be thin so that the tunneling magneto-resistance (TMR) phenomenon may occur.

Referring to FIG. 1B, when the first to third magnetic layers 110, 130 and 150 are magnetized in the vertical direction with respect to the upper surfaces thereof, although stray magnetic fields applied in the vertical direction may be formed at the centers of the first magnetic layer 110 and the third magnetic layer 150, the stray magnetic fields in the vertical direction which are developed by the first magnetic layer 110 and the third magnetic layer 150 may be offset by controlling the thicknesses and properties of the layers of the resistance variable element 100.

However, the stray magnetic fields formed at the peripheral portions of the first magnetic layer 110 and the third magnetic layer 150 may include horizontal components. When the stray magnetic fields applied in the horizontal direction of the first magnetic layer 110 and the third magnetic layer 150 have the same direction, they are not offset, but may multiply or intensify. By making the width of the first magnetic layer 110 wider than the width of the second magnetic layer 130, and thus separating the second magnetic layer 130 from the peripheral portions of the first magnetic layer 110, it is possible to minimize the influence on the second magnetic layer 130 by the stray magnetic fields applied in the horizontal direction. As described above, by controlling the width of the first magnetic layer 110 with respect to the second magnetic layer 130, it is possible to reduce the vertical stray magnetic field to approximately zero '0'.

Figure 3:
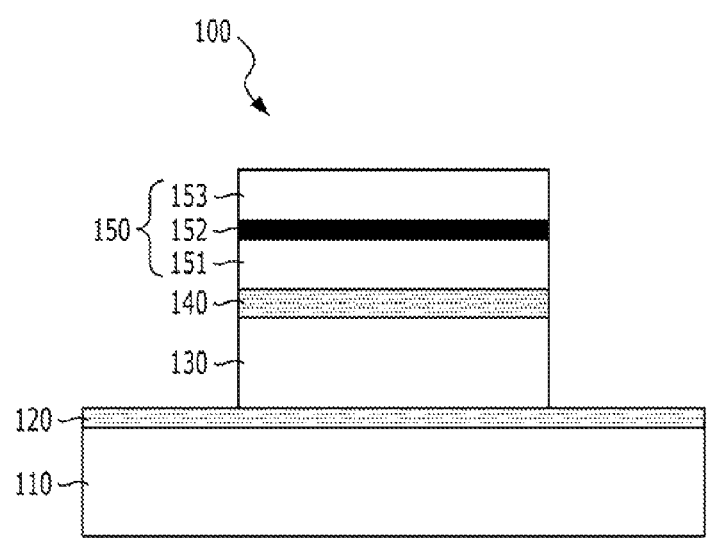
Figure 4:
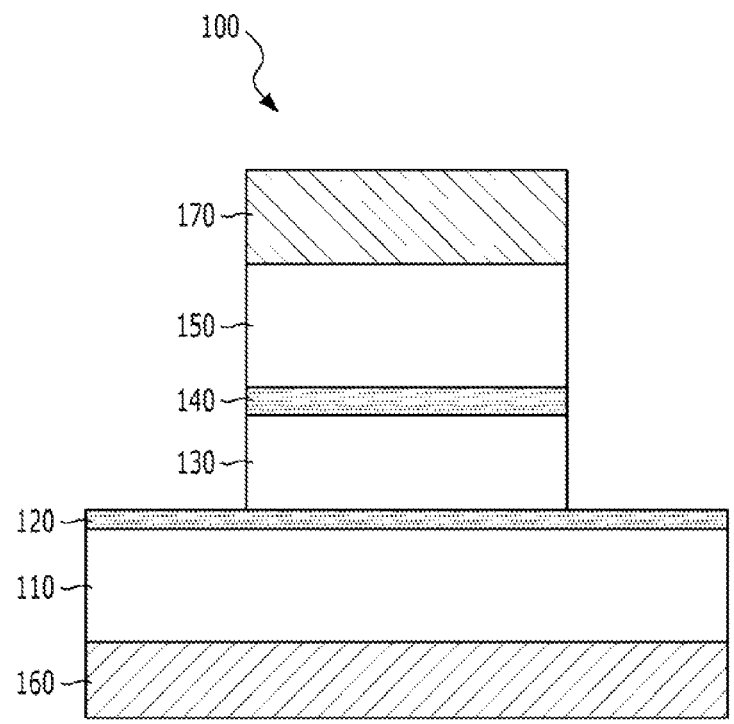

FIGS. 2 to 4 are cross-sectional views illustrating electronic devices in accordance with second to fourth implementations. In describing these implementations, detailed descriptions for substantially the same component parts as the aforementioned first implementation will be omitted.

Referring to FIG. 2, a resistance variable element 100 constituting an electronic device in accordance with a second implementation may include a first magnetic layer 110 with a pinned magnetization direction, a third magnetic layer 150 with a pinned magnetization direction, a second magnetic layer 130 that is interposed between the first magnetic layer 110 and the third magnetic layer 150 and having a changeable magnetization direction (or unpinned), a barrier layer 120 that is interposed between the first magnetic layer 110 and the second magnetic layer 130, and a dielectric layer 140 that is interposed between the second magnetic layer 130 and the third magnetic layer 150. The first magnetic layer 110 and the third magnetic layer 150 may have a wider width than the width of the second magnetic layer 130. The resistance variable element 100 may be stacked in the order reverse to whet is shown in FIG. 2.

Each of the first and third magnetic layers 110 and 150 may be formed to have a width 1.5 to 5 times wider than the width of the second magnetic layer 130. For example, each of the first and third magnetic layers 110 and 150 may have a width 2.5 times wider than the width of the second magnetic layer 130. As the second magnetic layer 130 is separated from peripheral portions of the first and third magnetic layers 110 and 150, it is possible to minimize influence on the second magnetic layer 130 from the stray magnetic fields formed in the first and third magnetic layers 110 and 150.

Referring to FIG. 3, a third magnetic layer 150 of a resistance variable element 100 constituting an electronic device in accordance with a third implementation may include a bottom magnetic layer 151, a top magnetic layer 153, and a nonmagnetic layer 152 interposed therebetween. The resistance variable element 100 may be stacked in the order reverse to what is shown in FIG. 3.

The bottom magnetic layer 151 and the top magnetic layer 153 may be magnetically coupled with the nonmagnetic layer 152 interposed therebetween. In an implement, the third magnetic layer 150 may have a magnetic pinned layer of a synthetic anti-ferromagnetic (SAF) layer structure including the top magnetic layer 151, the nonmagnetic layer 152 and the bottom magnetic layer 153. Each of the bottom magnetic layer 151 and the top magnetic layer 153 may include the aforementioned ferromagnetic material or alloy thereof. The nonmagnetic layer 152 may include a nonmagnetic conductive material such as ruthenium (Ru), chrome (Cr), copper (Cu), titanium (Ti), tungsten (W), and tantalum (Ta).

Referring to FIG. 4, a resistance variable element 100 constituting an electronic device in accordance with a fourth implementation has the same structure shown in FIG. 1 except that a first conductive layer 160 may be coupled to a first magnetic layer 110, and a second conductive layer 170 may be coupled to a third magnetic layer 150. The resistance variable element 100 may be stacked in the order reverse to what is shown in FIG. 4.

The first conductive layer 160 may be a seed layer serving as a base for forming an overlying structure such as the first magnetic layer 110 and so forth. The second conductive layer 170 may be a capping layer for protecting an underlying structure such as the third magnetic layer 150 and so forth. Each of the first and second conductive layers 160 and 170 may be single layer including a metal such as tantalum (Ta), titanium (Ti) ruthenium (Ru), hafnium (Hf), zirconium (Zr), aluminum (Al), tungsten (W), copper (Cu), gold (Au), silver (Ag), platinum (Pt), nickel (Ni), chrome (Cr) and cobalt (Co); or a single layer including a metal nitride such as a titanium nitride (TiN), a tantalum nitride (TaN), and a tungsten nitride (WN); or a multi-layered structure including a combination thereof.

Figure 5A:
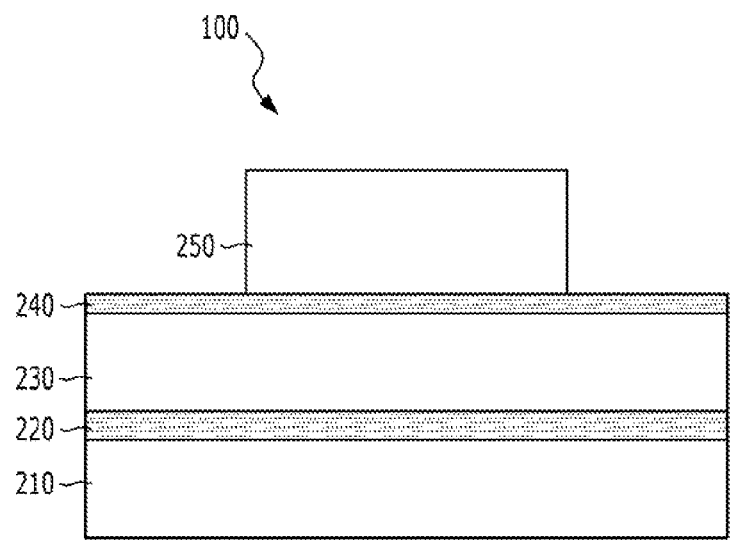
FIG. 5A is a cross-sectional view illustrating an electronic device in accordance with a fifth implementation.
Figure 5B:
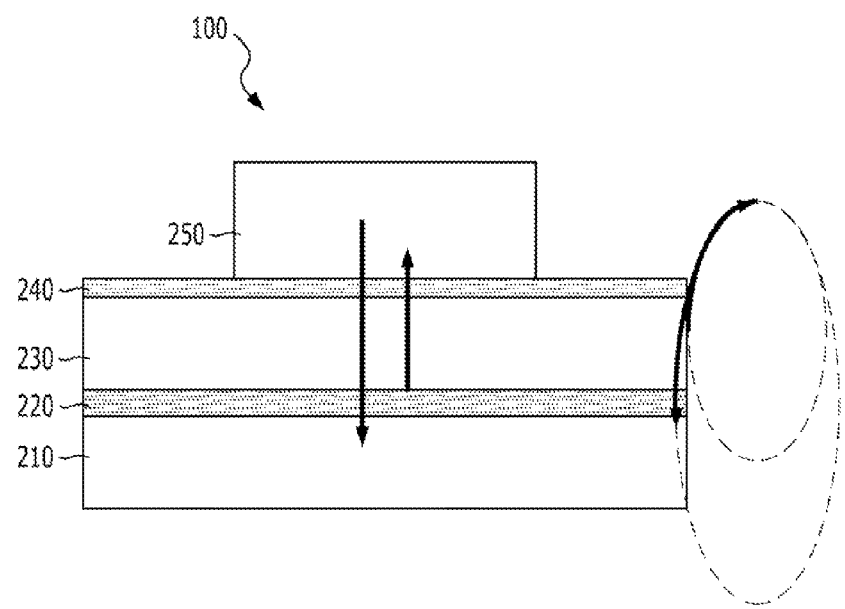
FIG. 5B is a cross-sectional view explaining a stray magnetic field which is applied to the electronic device in accordance with the fifth implementation.

FIG. 5A is a cross-sectional view illustrating an electronic device in accordance with a fifth implementation, and FIG. 5B is a cross-sectional view explaining a stray magnetic field which is applied to the electronic device in accordance with the fifth implementation.

Referring to FIG. 5A, a resistance variable element 100 constituting an electronic device in accordance with a fifth implementation may include a first magnetic layer 210 with a pinned magnetization direction, a third magnetic layer 250 with a pinned magnetization direction (or changeable or free), a second magnetic layer 230 which is interposed between the first magnetic layer 210 and the third magnetic layer 250 and having a pinned magnetization direction, a barrier layer 220 interposed between the first magnetic layer 210 and the second magnetic layer 230, and a dielectric layer 240 interposed between the second magnetic layer 230 and the third magnetic layer 250. Each of the first magnetic layer 210 and the second magnetic layer 230 may have a width wider than the width of the third magnetic layer 250. The resistance variable element 100 may be stacked in the order reverse to what is shown in FIG. 5A.

Each of the first to third magnetic layers 210, 230 and 250 may include: a ferromagnetic material such as ferrum (Fe), nickel (Ni), cobalt (Co), gadolinium (Gd) and dysprosium (Dy); or an alloy of the ferromagnetic material with a platinum group element such as platinum (Pt) and palladium (Pd), for example, cobalt-ferrum (CoFe), nickel-ferrum (NiFe), cobalt-ferrum-nickel (CoFeNi), cobalt-platinum (CoPt), cobalt-palladium (CoPd), ferrum-platinum (FePt) and ferrum-palladium (FePd). Various elements may be added to the ferromagnetic material and the alloy thereof to improve the properties of the first to third magnetic layers 210, 230 and 250. For example, each of the first to third magnetic layers 210, 230 and 250 may be: a single layer including cobalt-ferrum-boron (CoFeB), cobalt-platinum-boron (CoPtB), cobalt-palladium-boron (CoPdB), ferrum-platinum-boron (FePtB) and ferrum-palladium-boron (FePdB) which are prepared by adding boron (B) to cobalt-ferrum (CoFe), cobalt-platinum (CoPt), cobalt-palladium (CoPd), ferrum-platinum (FePt), or ferrum-palladium (FePd); a single layer further including an additive such as cobalt-ferrum-boron-tantalum (CoFeBTa) or cobalt-ferrum-boron-silicon (CoFeBSi), which are prepared by adding tantalum or silicon to cobalt-ferrum-boron (CoFeB); or a multi-layer including a combination of the single layers.

The first to third magnetic layers 210, 230 and 250 may be magnetized in the vertical direction with respect to upper surfaces thereof. By forming the width of the first and second magnetic layers 210 and 230 wider than the width of the third magnetic layer 250, it is possible to minimize the influence on the third magnetic layer 250 by stray magnetic fields which are formed in the horizontal direction and are mainly formed at peripheral' regions of the first and second magnetic layers 210 and 230. Each of the first and second magnetic layers 210 and 230 may be formed to have a width 1.5 to 5 times wider than the width of the third magnetic layer 250. For example, each of the first and second magnetic layers 210 and 230 may have a width 2.5 times wider than the width of the third magnetic layer 250. The first to third magnetic layers 210, 230 and 250 may be magnetized in the horizontal direction with respect to the upper surfaces thereof. By forming the width of each of the first and second magnetic layers 210 and 230 wider than the width of the third magnetic layer 250, it is possible to minimize the influence by the stray magnetic field applied in the horizontal direction on the third magnetic layer 250.

The barrier layer 220 may include a conductive material which may magnetically isolate the first magnetic layer 210 and the second magnetic layer 230 from each other. For example, the barrier layer 220 may be a single layer including a nonmagnetic metal such as ruthenium (Ru), chrome (Cr), copper (Cu), titanium (Ti), tungsten (W) and tantalum (Ta), or a multi-layer including a combination thereof.

The dielectric layer 240 serving as a tunneling barrier may be formed by depositing a nonmagnetic dielectric material such as a magnesium oxide (MgO), an aluminum oxide (AlO), a silicon oxide (SiO), a bismuth oxide (BiO), a magnesium nitride (MgN), an aluminum nitride (AlN), a silicon nitride (SiN), a magnesium fluoride (MgF) and a calcium fluoride (CaF), through RF (radio frequency) sputtering or pulsed DC (direct current) sputtering. In another implementation, the dielectric layer 240 may be formed by depositing a metal such as magnesium (Mg), aluminum (Al), titanium (Ti), tantalum (Ta) and hafnium (Hf) and then oxidizing the deposited metal. The dielectric layer 240 may have a thin thickness suitable for the tunneling magneto-resistance (TMR) phenomenon to occur.

Referring to FIG. 5B, when the first to third magnetic layers 210, 230 and 250 are magnetized in the vertical direction with respect to the upper surfaces thereof, stray magnetic fields applied in the vertical direction may be formed at the center portions of the first magnetic layer 210 and the second magnetic layer 230. The stray magnetic fields applied in the vertical direction may be offset by controlling thicknesses and properties of the layers constituting the resistance variable element 100. However, the stray magnetic fields formed at peripheral portions of the first magnetic layer 210 and the second magnetic layer 230 may include horizontal components. The stray magnetic fields applied in the horizontal direction, which are formed by the first magnetic layer 210 and the second magnetic layer 230, may not be completely offset by each other. By forming the width of the first and second magnetic layers 210 and 230 wider than the width of the third magnetic layer 250, and thus separating the third magnetic layer 250 from the peripheral portions of the first and second magnetic layers 210 and 230, it is possible to minimize influence on the third magnetic layer 250 from the horizontal stray magnetic fields.

Figure 6:
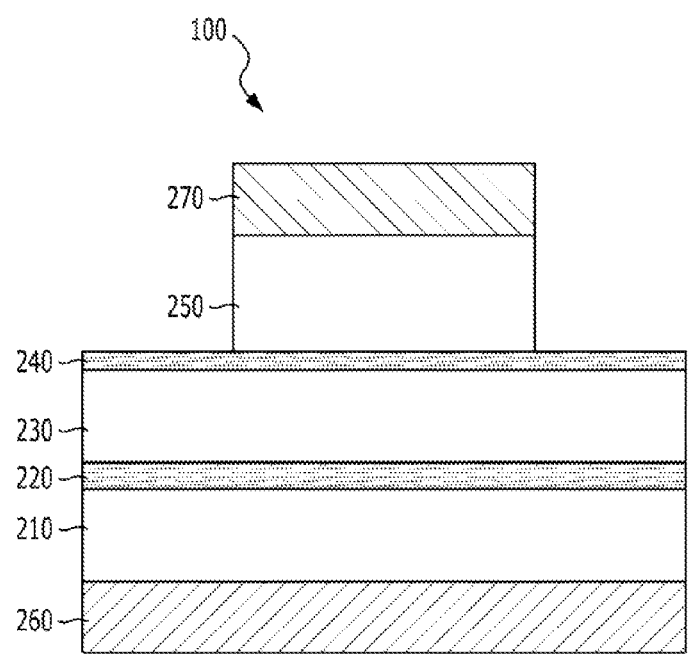
FIG. 6 is a cross-sectional view illustrating an electronic device in accordance with a sixth implementation.

FIG. 6 is a cross-sectional view illustrating an electronic device in accordance with a sixth implementation. In describing the present implementation, detailed descriptions of features that are substantially the same as those in the aforementioned fifth implementation will be omitted.

Referring to FIG. 6, a resistance variable element 100 constituting an electronic device in accordance with a sixth implementation has the same structure as shown in FIGS. 5A and 58, except that it further includes a first conductive layer 260 coupled to a first magnetic layer 210, and a second conductive layer 270 coupled to a third magnetic layer 250. In another implement, the resistance variable element 100 may be stacked in the order reverse to what is shown in FIG. 6.

The first conductive layer 260 may be a seed layer serving as a base for forming an overlying structure, such as the first magnetic layer 210 and so forth. The second conductive layer 270 may be a capping layer for protecting an underlying structure such as the third magnetic layer 250 and so forth. Each of the first and second conductive layers 260 and 270 may be: a single layer including a metal such as tantalum (Ta), titanium (Ti) ruthenium (Ru), hafnium (Hf), zirconium (Zr), aluminum (Al), tungsten (W), copper (Cu), gold (Au), silver (Ag), platinum (Pt), nickel (Ni) chrome (Cr), and cobalt (Co); a metal nitride such as a titanium nitride (TiN), a tantalum nitride (TaN), and a tungsten nitride (WN); or a multi-layer including a combination thereof.

FIGS. 8A to 8D are cross-sectional views of an electronic device in accordance with an implementation.

Figure 8A:
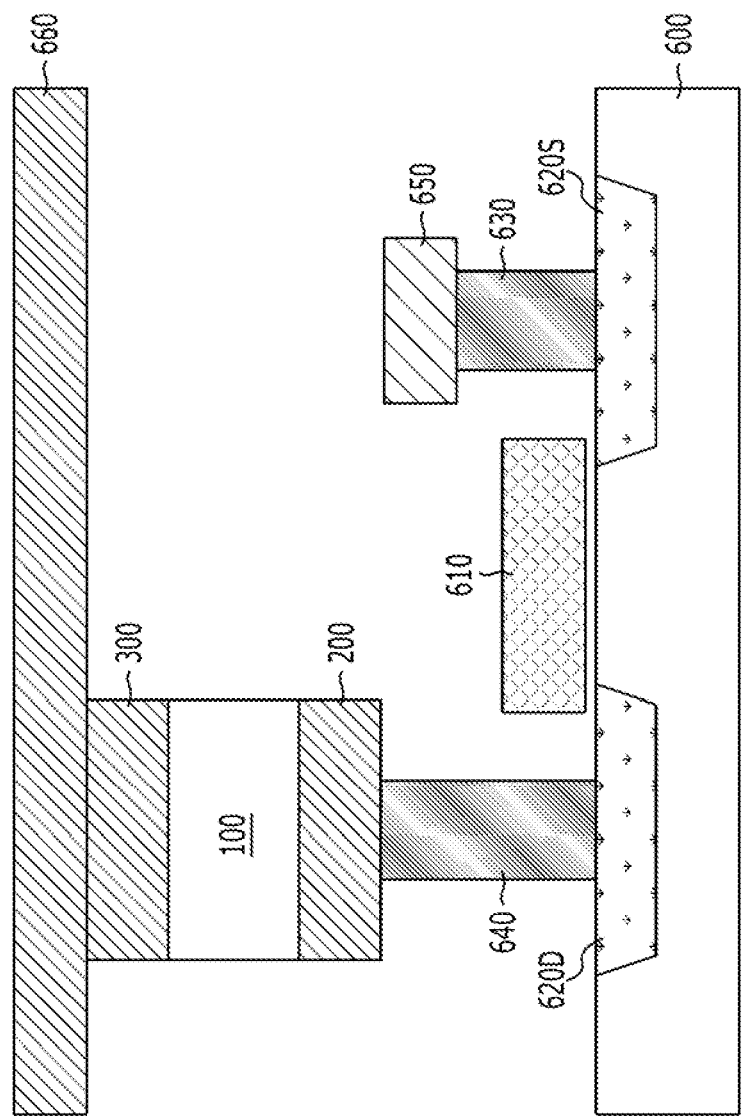
FIGS. 8A to 8D are cross-sectional views of an electronic device in accordance with an implementation.

Referring to FIG. 8A, an electronic device in accordance with an implementation includes a first electrode 200, a second electrode 300 separated from the first electrode 200, and a resistance variable element 100 interposed between the first electrode 200 and the second electrode 300. The first electrode 200 may be electrically coupled to a transistor, and the second electrode 300 may be electrically coupled to a bit line 660.

The transistor is used as a switch which performs on/off operations, and may be an NMOS (N-channel metal oxide semiconductor) transistor or a PMOS (P-channel metal oxide semiconductor) transistor. Such a transistor may include a gate electrode 610 which is formed on a substrate 600, and a source region 620S and a drain region 620D which are formed in the substrate 600 on both sides of the gate electrode 610. A gate dielectric layer (not shown) may be interposed between the substrate 600 and the gate electrode 610. The source region 620S may be coupled to a source line 650 through a contact plug 630 or the like. The drain region 620D may be coupled to the first electrode 200 through a contact plug 640 or the like.

The substrate 600 may be a silicon (Si) substrate, a germanium (Ge) substrate, a silicon-germanium (SiGe) substrate, or an SOI (silicon-on-insulator) substrate. The source region 620S and the drain region 620D may be formed by implanting impurities into the substrate 600 through an ion implantation process or the like. Further, each of the gate electrode 610, the contact plugs 630 and 640, the source line 650, and the bit line 660 may include a conductive material such as metal, metal nitride or doped silicon.

Figure 8B:
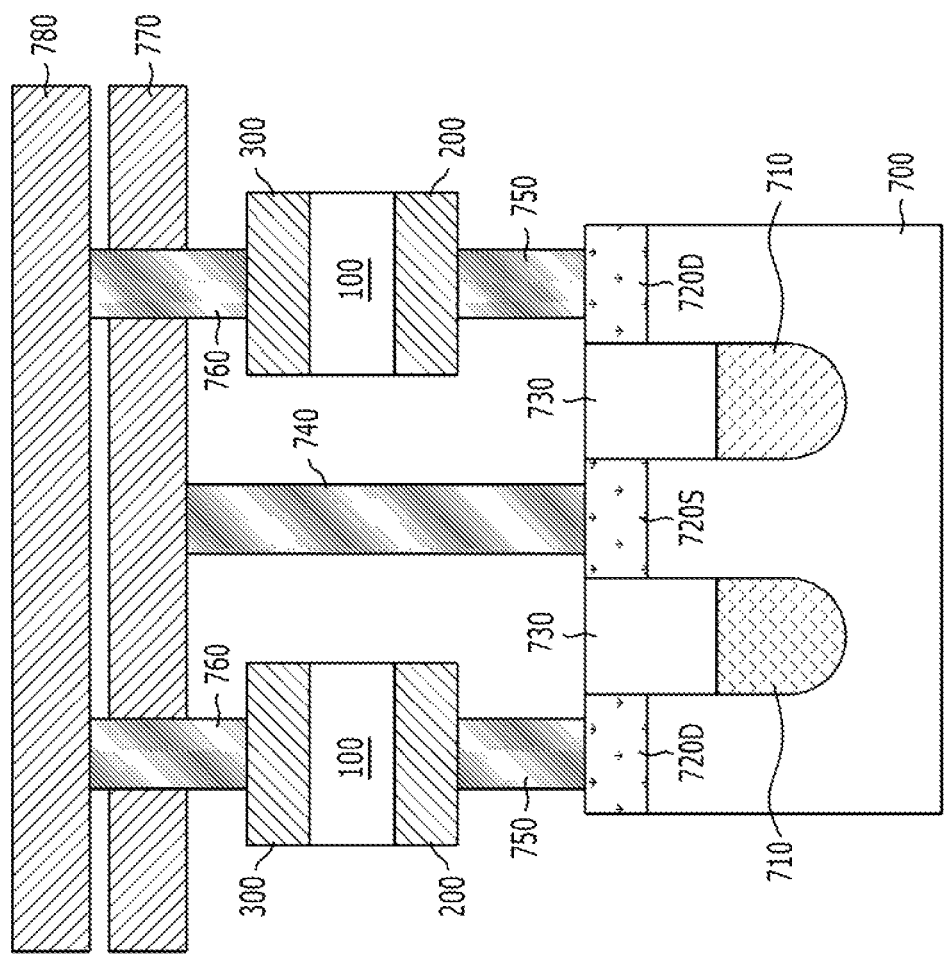

Referring to FIG. 8B, an electronic device in accordance with an implementation includes a first electrode 200 electrically coupled to a transistor, which has a gate electrode 710 buried in a substrate 700 and a second electrode 300, electrically coupled to a bit line 780 through a contact plug 760 or the like. A protective layer 730 may be formed on the gate electrode 710. A source region 720S and a drain region 720D implanted with impurities may be formed in the substrate 700 on both sides of the protective layer 730. The source region 720S may be coupled to a source line 770 through a contact plug 740 or the like, and the drain region 720D may be coupled to the first electrode 200 through a contact plug 750 or the like.

The substrate 700 may be a semiconductor substrate including silicon, germanium, etc., and a gate dielectric layer may be interposed between the substrate 700 and the gate electrode 710. The protective layer 730 may include an oxide-containing or nitride-containing material. Each of the gate electrode 710, the contact plugs 740, 750 and 760, the source line 770, and the bit line 780 may include the conductive material as described above.

Figure 8C:
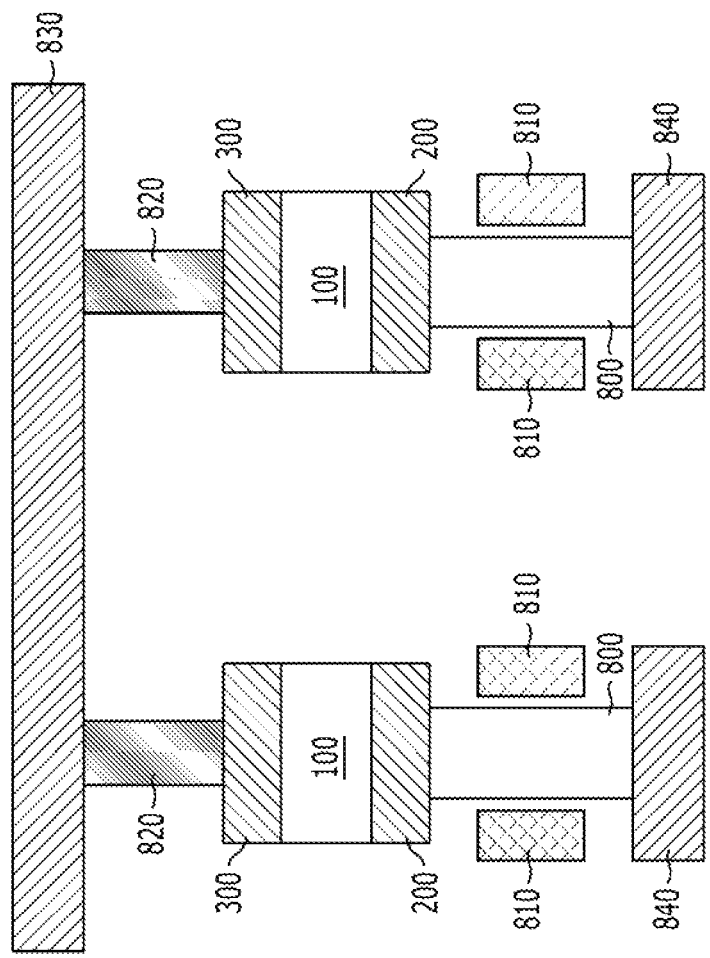

Referring to FIG. 8C, an electronic device in accordance with an implementation includes a first electrode 200 electrically coupled to a transistor, which has a vertical channel layer 800, and a second electrode 300, which may be electrically coupled to a bit line 830 through a contact plug 820 or the like. A gate electrode 810 may be disposed adjacent to at least a portion of the side surface of the channel layer, and a gate dielectric layer (not shown) may be interposed between the channel layer 800 and the gate electrode 810. The top end of the channel layer 800 may be coupled to the first electrode 200, and the bottom end of the channel layer 800 may be coupled to a source line 840.

The channel layer 800 may include a semiconductor mate such as silicon and germanium, and junction regions (not shown) doped with impurities may be formed in the top and bottom ends of the channel layer 800. Each of the gate electrode 810, the contact plug 820, the bit line 830, and the source line 840 may include the conductive material as described above.

Figure 8D:
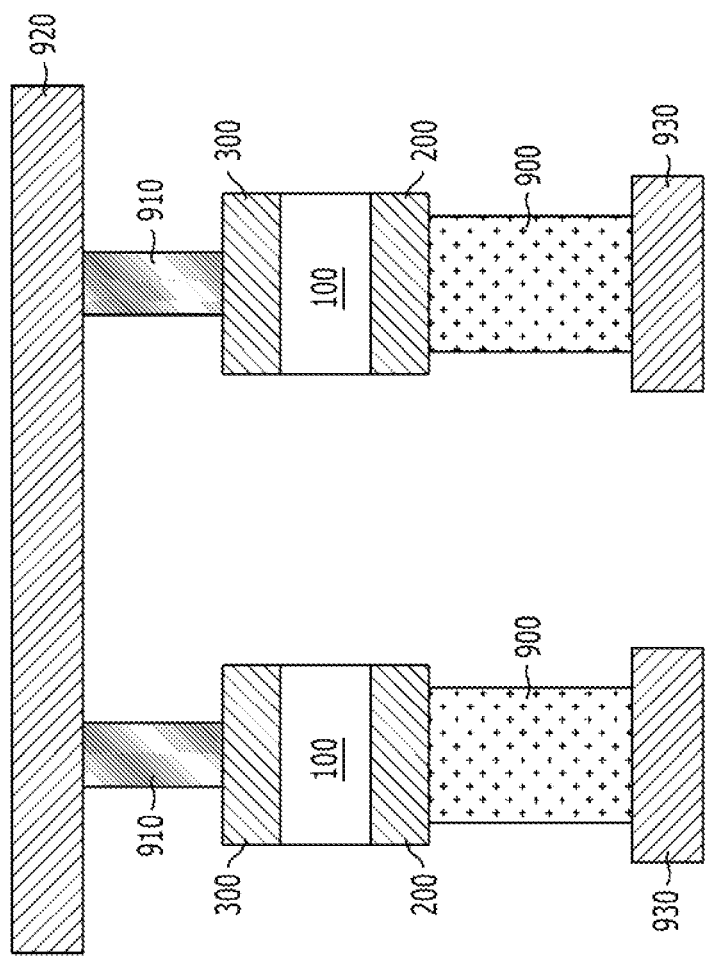

Referring to FIG. 8D, an electronic device in accordance with an implementation includes a first electrode 200 electrically coupled to one end of a select element 900 and a second electrode 300 electrically coupled to a bit line 920 through a contact plug 910 or the like. The other end of the select element 900 is coupled to a word line 930. The bit line 920 and the word line 930 may extend in directions crossing with each other.

The select element 900 may be a diode such as a Schottky diode, a PN diode, a PIN diode, or an MIN diode. The select element 900 may include; (i) a tunnel barrier which has a nonlinear current-voltage characteristic; (ii) a metal-insulator transition (MIT) element which transforms between dielectric material and metal at a given temperature, thereby abruptly changing its electrical resistance; or (iii) an ovonic switching element which is capable of being switched at a given threshold voltage. Each of the contact plug 910, the bit line 920, and the word line 930 may include conductive materials as described above.

FIGS. 9-13 provide some examples of devices or systems that may implement the memory circuits disclosed herein.

Figure 9:
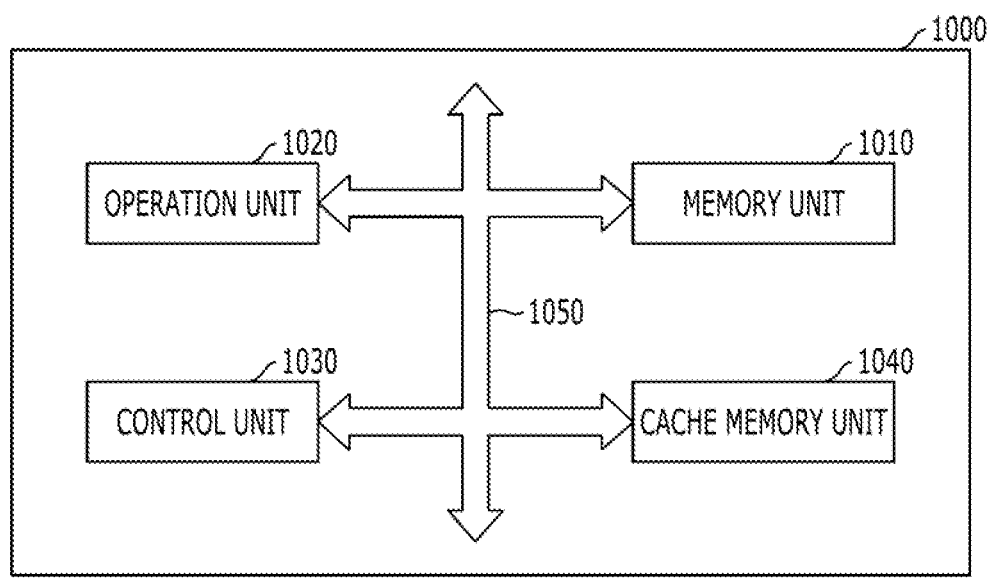
FIG. 9 is an example of configuration diagram of a microprocessor implementing memory circuitry based on the disclosed technology.

FIG. 9 is an example of configuration diagram of a microprocessor implementing memory circuitry based on the disclosed technology.

Referring to FIG. 9, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, or the like. The memory unit 1010 may include a data register, an address register, a floating point register and so on Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a first magnetic layer pinned in its magnetization direction, a third magnetic layer pinned in its magnetization direction, a second magnetic layer interposed between the first magnetic layer and the third magnetic layer, and changeable in its magnetization direction, a barrier layer interposed between the first magnetic layer and the second magnetic layer, and a dielectric layer interposed between the second magnetic layer and the third magnetic layer. The first magnetic layer has a width 1.5 to 5 times wider than a width of the second magnetic layer.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 10:
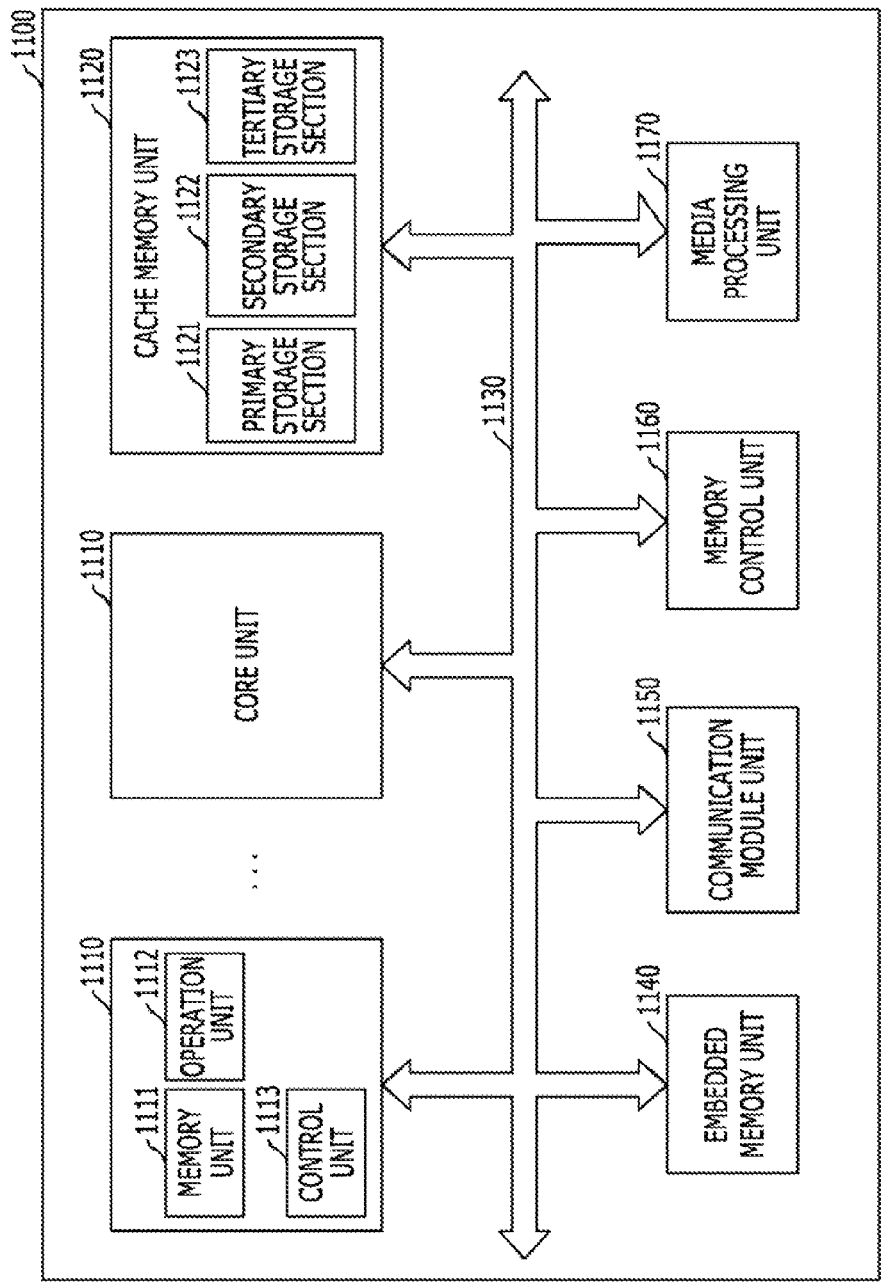
FIG. 10 is an example of configuration diagram of a processor implementing memory circuitry based on the disclosed technology.

FIG. 10 is an example of configuration diagram of a processor implementing memory circuitry based on the disclosed technology.

Referring to FIG. 10, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a first magnetic layer pinned in its magnetization direction, a third magnetic layer pinned in its magnetization direction, a second magnetic layer interposed between the first magnetic layer and the third magnetic layer, and changeable in its magnetization direction, a barrier layer interposed between the first magnetic layer and the second magnetic layer, and a dielectric layer interposed between the second magnetic layer and the third magnetic layer. The first magnetic layer has a width 1.5 to 5 times wider than a width of the second magnetic layer.

Although it was shown in FIG. 10 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 11:
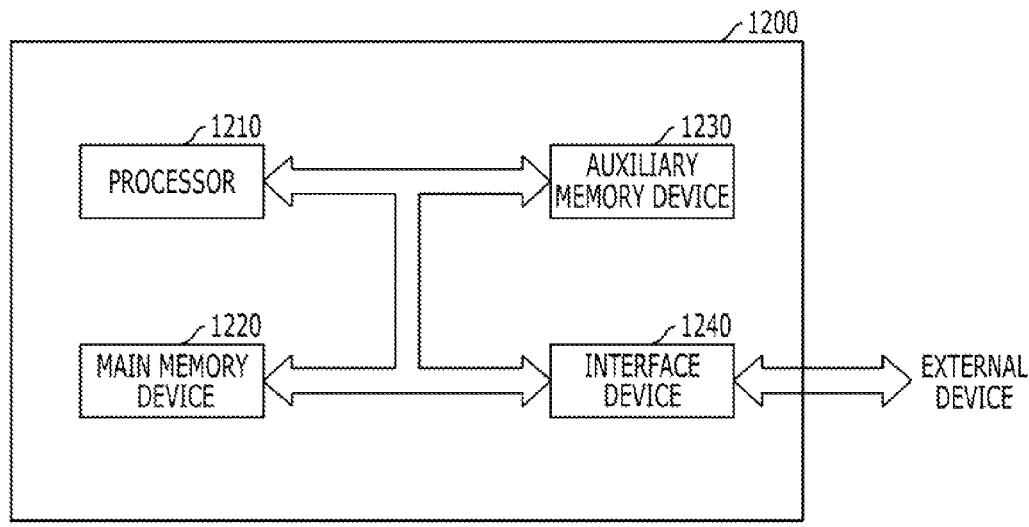
FIG. 11 is an example of configuration diagram of a system implementing memory circuitry based on the disclosed technology.

FIG. 11 is an example of configuration diagram of a system implementing memory circuitry based on the disclosed technology.

Referring to FIG. 11, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which may temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a first magnetic layer pinned in its magnetization direction, a third magnetic layer pinned in its magnetization direction, a second magnetic layer interposed between the first magnetic layer and the third magnetic layer, and changeable in its magnetization direction, a barrier layer interposed between the first magnetic layer and the second magnetic layer, and a dielectric layer interposed between the second magnetic layer and the third magnetic layer. The first magnetic layer has a width 1.5 to 5 times wider than a width of the second magnetic layer.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a resistance variable element which includes a free magnetic layer, a tunnel barrier layer and a pinned magnetic layer, and a magnetic correction layer which is disposed over the resistance variable element to be separated from the resistance variable element and has a magnetization direction opposite to a magnetization direction of the pinned magnetic layer. Through this, a fabrication process of the auxiliary memory device 1230 may become easy and the reliability of the auxiliary memory device 1230 may be improved. As a consequence, a fabrication process of the system 1200 may become easy and the reliability of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC) a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA) a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 12:
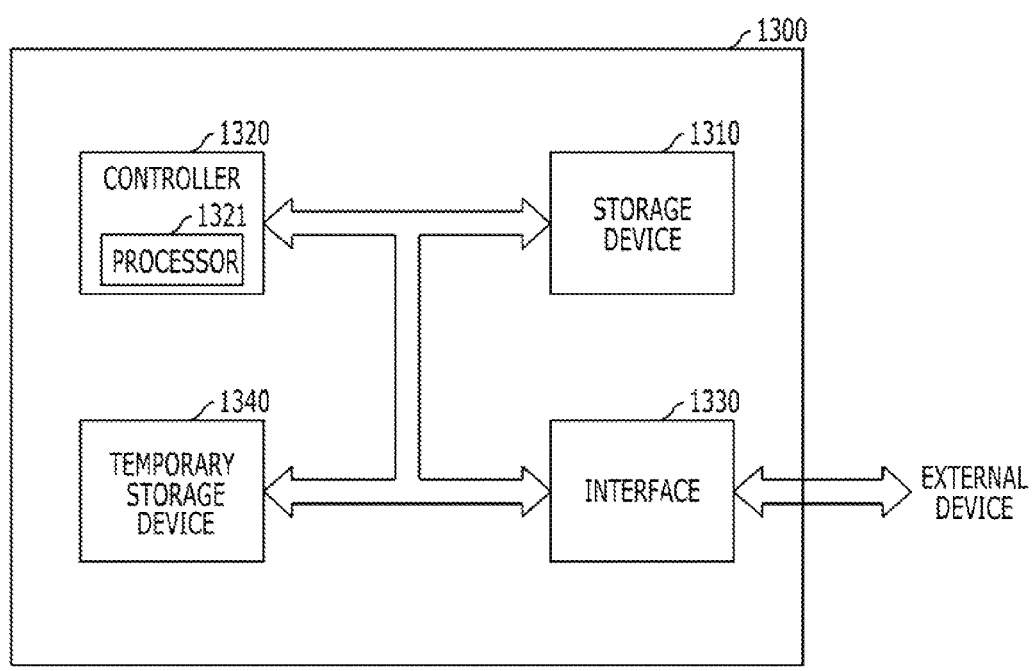
FIG. 12 is an example of configuration diagram of a data storage system implementing memory circuitry based on the disclosed technology.

FIG. 12 is an example of configuration diagram of a data storage system implementing memory circuitry based on the disclosed technology.

Referring to FIG. 12, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal, serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a first magnetic layer pinned in its magnetization direction, a third magnetic layer pinned in its magnetization direction, a second magnetic layer interposed between the first magnetic layer and the third magnetic layer, and changeable in its magnetization direction, a barrier layer interposed between the first magnetic layer and the second magnetic layer, and a dielectric layer interposed between the second magnetic layer and the third magnetic layer. The first magnetic layer has a width 1.5 to 5 times wider than a width of the second magnetic layer.

Figure 13:
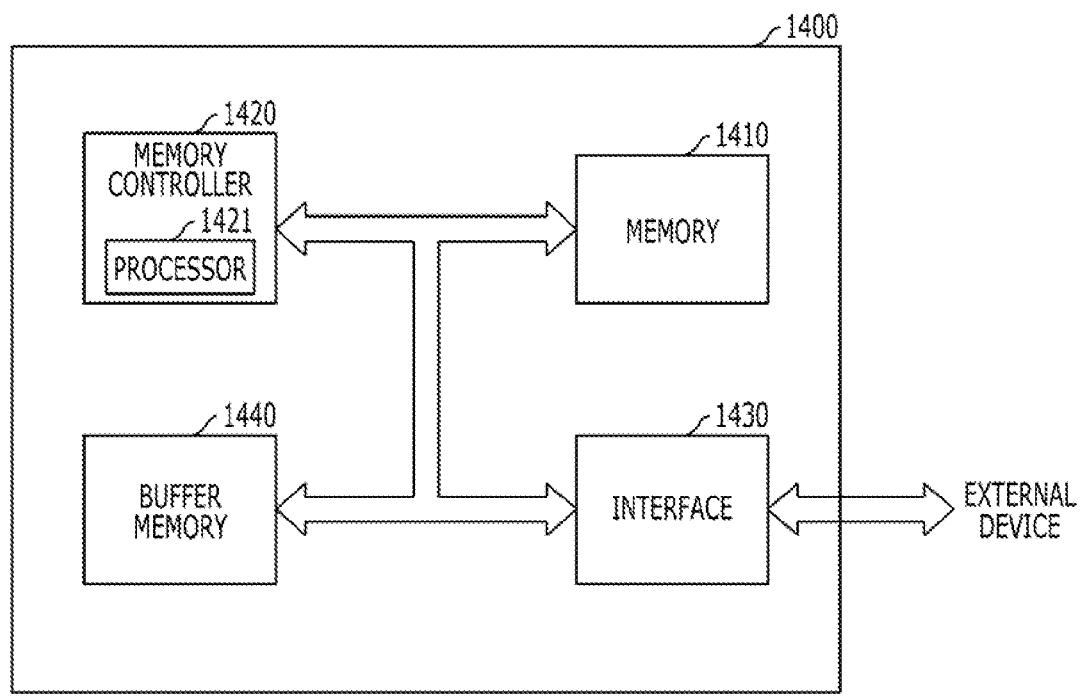
FIG. 13 is an example of configuration diagram of a memory system implementing memory circuitry based on the disclosed technology.

FIG. 13 is an example of configuration diagram of a memory system implementing memory circuitry based on the disclosed technology.

Referring to FIG. 13, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a first magnetic layer pinned in its magnetization direction, a third magnetic layer pinned in its magnetization direction, a second magnetic layer interposed between the first magnetic layer and the third magnetic layer, and changeable in Its magnetization direction, a barrier layer interposed between the first magnetic layer and the second magnetic layer, and a dielectric layer interposed between the second magnetic layer and the third magnetic layer. The first magnetic layer has a width 1.5 to 5 times wider than a width of the second magnetic layer.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a first magnetic layer pinned in its magnetization direction, a third magnetic layer pinned in its magnetization direction, a second magnetic layer interposed between the first magnetic layer and the third magnetic layer, and changeable in its magnetization direction, a barrier layer interposed between the first magnetic layer and the second magnetic layer, and a dielectric layer interposed between the second magnetic layer and the third magnetic layer. The first magnetic layer has a width 1.5 to 5 times wider than a width of the second magnetic layer.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

As is apparent from the above descriptions, in the semiconductor device and the method for fabricating the same in accordance with the implementations, patterning of a resistance variable element is easy, and it is possible to secure the characteristics of the resistance variable element.

Features in the above examples of electronic devices or systems in FIGS. 8-12 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

By the electronic device according to the implementations of the present disclosure described above, the switching characteristic of a resistance variable element may be improved by controlling the relative width of a pinned magnetic layer to a condition where a total sum of the horizontal component and the vertical component of a stray magnetic field influencing a free magnetic layer is minimized.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory unit that comprises:
   a first magnetic layer with a pinned magnetization direction;
   a third magnetic layer with a pinned magnetization direction;
   a second magnetic layer interposed between the first magnetic layer and the third magnetic layer, and with an unpinned magnetization direction;
   a barrier layer interposed between the first magnetic layer and the second magnetic layer; and
   a dielectric layer interposed between the second magnetic layer and the third magnetic layer,
   wherein the width of the first magnetic layer is 1.5 to 5 times wider than the width of the second magnetic layer such that the second magnetic layer is protected from stray magnetic fields in a horizontal direction parallel to upper surfaces of the first to third magnetic layers.

2. The electronic device according to claim 1, wherein the width of the third magnetic layer is 1.5 to 5 times wider than the width of the second magnetic layer such that the second magnetic layer is protected from the stray magnetic fields in the horizontal direction parallel to the upper surfaces of the first to third magnetic layers.

3. The electronic device according to claim 1, wherein the first to third magnetic layers are magnetized in a vertical direction perpendicular to the upper surfaces of the first to third magnetic layers.

4. The electronic device according to claim 1, wherein the first to third magnetic layers are magnetized in the horizontal direction.

5. The electronic device according to claim 1, wherein the barrier layer comprises dielectric material or nonmagnetic conductive material.

6. The electronic device according to claim 1, wherein the third magnetic layer comprises a bottom magnetic layer, a top magnetic layer and a nonmagnetic layer which is interposed between the bottom magnetic layer and the top magnetic layer.

7. The electronic device according to claim 3, wherein the width of the first magnetic layer is about 2.5 times wider than the width of the second magnetic layer such that a stray magnetic field in the vertical direction is approximately 0.

8. The electronic device according to claim 1, wherein the semiconductor memory unit further comprises:
   a first conductive layer coupled to the first magnetic layer; and
   a second conductive layer coupled to the third magnetic layer.

9. The electronic device according to claim 1, further comprising a processor which includes:
   a core unit configured to perform, based on a command inputted from an outside of the processor, an operation corresponding to the command, by using data;
   a cache memory unit configured to store data for performing the operation, data corresponding to a result of performing the operation, or an address of data for which the operation is performed; and
   a bus interface connected between the core unit and the cache memory unit, and configured to transmit data between the core unit and the cache memory unit,
   wherein the semiconductor memory unit that is part of the cache memory unit in the processor.

10. An electronic device comprising a semiconductor memory unit that comprises:
    a first magnetic layer with a pinned magnetization direction;
    a third magnetic layer with an unpinned magnetization direction;
    a second magnetic layer interposed between the first magnetic layer and the third magnetic layer, and with a pinned magnetization direction;
    a barrier layer interposed between the first magnetic layer and the second magnetic layer; and
    a dielectric layer interposed between the second magnetic layer and the third magnetic layer,
    wherein the width of the second magnetic layer is 1.5 to 5 times wider than the width of the third magnetic layer such that the third magnetic layer is protected from stray magnetic fields in a horizontal direction parallel to upper surfaces of the first to third magnetic layers.

11. The electronic device according to claim 10, wherein the width of the first magnetic layer is 1.5 to 5 times wider than the width of the third magnetic layer such that the third magnetic layer is protected from the stray magnetic fields in the horizontal direction parallel to the upper surfaces of the first to third magnetic layers.

12. The electronic device according to claim 10, wherein the first to third magnetic layers are magnetized in a vertical direction, which is perpendicular to upper surfaces of the first to third magnetic layers.

13. The electronic device according to claim 10, wherein the first to third magnetic layers are magnetized in the horizontal direction.

14. The electronic device according to claim 10, wherein the barrier layer comprises nonmagnetic conductive material.

15. The electronic device according to claim 12, wherein the width of the second magnetic layer is about 2.5 times wider than the width of the third magnetic layer such that a stray magnetic field in the vertical direction is approximately 0.

16. The electronic device according to claim 10, wherein the semiconductor memory unit further comprises:
    a first conductive layer coupled to the first magnetic layer; and
    a second conductive layer coupled to the third magnetic layer.

17. An electronic device comprising:
    a first magnetic layer with a pinned magnetization direction;
    a second magnetic layer with an unpinned magnetization direction; and
    a third magnetic layer with a pinned magnetization direction;
    wherein the first, the second, and the third magnetic layers form a stacked structure, and
    wherein at least one of the first and the third magnetic layers has a width 1.5 to 5 times wider than the width of the second magnetic layer such that the second magnetic layer is protected from stray magnetic fields in a horizontal direction parallel to upper surfaces of the first to third magnetic layers.

18. The electronic device of claim 17, wherein the second magnetic layer is provided between the first and the third magnetic layers.

19. The electronic device of claim 17, wherein the first magnetic layer is provided between the second and the third magnetic layers.

20. The electronic device of claim 17, wherein the third magnetic layer is provided between the first and the second magnetic layers.

* * * * *